(12) United States Patent
Chaffins et al.

(10) Patent No.: US 12,138,860 B2
(45) Date of Patent: Nov. 12, 2024

(54) THREE-DIMENSIONAL PRINTING CONDUCTIVE ELEMENTS

(71) Applicant: Hewlett-Packard Development Company, L.P., Spring, TX (US)

(72) Inventors: Sterling Chaffins, Corvallis, OR (US); Thomas A. Saksa, Corvallis, OR (US); Kevin P. DeKam, Corvallis, OR (US); Juan Sebastian Ramirez, Key Biscayne, FL (US); Dale Peterson, Corvallis, OR (US); Jami Ryan Barone, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 389 days.

(21) Appl. No.: 17/288,550

(22) PCT Filed: Apr. 29, 2019

(86) PCT No.: PCT/US2019/029655
§ 371 (c)(1),
(2) Date: Apr. 25, 2021

(87) PCT Pub. No.: WO2020/222743
PCT Pub. Date: Nov. 5, 2020

(65) Prior Publication Data
US 2022/0063189 A1  Mar. 3, 2022

(51) Int. Cl.
*B29C 64/295* (2017.01)
*B22F 1/054* (2022.01)
(Continued)

(52) U.S. Cl.
CPC ............ *B29C 64/295* (2017.08); *B22F 1/054* (2022.01); *B22F 1/056* (2022.01); *B22F 1/10* (2022.01);
(Continued)

(58) Field of Classification Search
CPC .................................................. B29C 64/295
See application file for complete search history.

(56) References Cited

U.S. PATENT DOCUMENTS

| 5,028,473 A | 7/1991 | Vitriol et al. |
| 2004/0013982 A1 | 1/2004 | Jacobson et al. |

(Continued)

FOREIGN PATENT DOCUMENTS

| WO | WO-2018022034 A1 | 2/2018 |
| WO | WO-2018151706 A1 | 2/2018 |

*Primary Examiner* — Timothy Kennedy
(74) *Attorney, Agent, or Firm* — HP Inc. Patent Department (57) ABSTRACT

Methods and systems for making three-dimensional printed articles. In one example, a method of making a three-dimensional article can include printing a conductive element including a composite of a conductive material and a polymeric build material; printing an adjacent portion in contact with the conductive element, where the adjacent portion includes a nonconductive polymeric build material; and heating the conductive element by running an electric current through the conductive element, and thereby heating the adjacent portion to a temperature sufficient to change a physical property of the nonconductive polymeric build material of the adjacent portion.

15 Claims, 6 Drawing Sheets

(51) Int. Cl.
- *B22F 1/10* (2022.01)
- *B29C 64/165* (2017.01)
- *B29C 64/268* (2017.01)
- *B33Y 70/10* (2020.01)
- *B33Y 10/00* (2015.01)
- *B33Y 30/00* (2015.01)

(52) U.S. Cl.
CPC .......... *B29C 64/165* (2017.08); *B29C 64/268* (2017.08); *B33Y 70/10* (2020.01); *B29K 2995/0005* (2013.01); *B33Y 10/00* (2014.12); *B33Y 30/00* (2014.12)

(56) References Cited

U.S. PATENT DOCUMENTS

| | | | |
|---|---|---|---|
| 2008/0063866 A1 | 3/2008 | Allen et al. | |
| 2011/0203937 A1* | 8/2011 | Sidhu | C25D 5/04 |
| | | | 205/133 |
| 2012/0018115 A1* | 1/2012 | Hovel | B22F 12/13 |
| | | | 164/492 |
| 2013/0127083 A1 | 5/2013 | Bobbitt, III | |
| 2014/0231266 A1 | 8/2014 | Sherrer et al. | |
| 2014/0239553 A1* | 8/2014 | Bamberg | B29C 64/153 |
| | | | 264/460 |
| 2015/0064050 A1* | 3/2015 | Retze | B33Y 50/02 |
| | | | 219/601 |
| 2015/0197062 A1 | 7/2015 | Shinar et al. | |
| 2015/0306664 A1 | 10/2015 | Aklint et al. | |
| 2016/0120040 A1 | 4/2016 | Elmieh et al. | |
| 2016/0325491 A1* | 11/2016 | Sweeney | B29C 64/264 |
| 2017/0355019 A1* | 12/2017 | Karlen | B22F 10/25 |
| 2018/0141151 A1 | 5/2018 | Liang et al. | |
| 2018/0208762 A1 | 7/2018 | Pomestchenko et al. | |
| 2019/0030602 A1 | 1/2019 | Sachs et al. | |

\* cited by examiner

THREE-DIMENSIONAL PRINTING CONDUCTIVE ELEMENTS

BACKGROUND

Methods of three-dimensional (3D) digital printing, a type of additive manufacturing, have continued to be developed over the last few decades. However, systems for 3D printing have historically been very expensive, though those expenses have been coming down to more affordable levels recently. In general, 3D printing technology can shorten the product development cycle by allowing rapid creation of prototype models for reviewing and testing. Unfortunately, the concept has been somewhat limited with respect to commercial production capabilities because the range of materials used in 3D printing is likewise limited. Accordingly, it can be difficult to 3D print functional parts with desired properties such as mechanical strength, visual appearance, and so on. Nevertheless, several commercial sectors such as aviation and the medical industry have benefitted from the ability to rapidly prototype and customize parts for customers.

The figures depict several examples of the presently disclosed technology. However, it should be understood that the present technology is not limited to the examples depicted.

DETAILED DESCRIPTION

The present disclosure describes methods of making three-dimensional printed articles. In one example, a method of making a three-dimensional printed article can include printing a conductive element that includes a composite of a conductive material and a polymeric build material. An adjacent portion can be printed in contact with the conductive element. The adjacent portion can include a nonconductive polymeric build material. The conductive element can be heated by running an electric current through the conductive element, and thereby heating the adjacent portion to a temperature sufficient to change a physical property of the nonconductive polymeric build material of the adjacent portion. In certain examples, the physical property can be tensile strength, elasticity, density, surface roughness, abrasion resistance, rebound, compression, porosity, elongation, hardness, or a combination thereof. In one example, the heating can soften the adjacent portion of the three-dimensional printed article and the method can further include bending the three-dimensional printed article at the adjacent portion. In a certain example, bending the article can include fitting the article to a second article, and the method can further include cooling the article so that the article maintains the bent configuration. In yet another example, the conductive element can be formed at a distance from about 0.01 mm to about 2 mm below a surface of the three-dimensional printed article, wherein the adjacent portion is a portion of the three-dimensional printed article at the surface, and wherein the heating softens the adjacent portion and causes the surface to become smoother at the adjacent portion. In another example, the conductive element can have a first resistance before the heating and a second resistance after the heating, and the first resistance can be from about 10 to about 10,000 times greater than the second resistance. In some examples, the conductive material can include silver particles, copper particles, gold particles, nickel particles, carbon particles, or a combination thereof. In further examples, the conductive element can also include an inductively responsive material. In still further examples, the nonconductive polymeric build material can be nylon 6, nylon 9, nylon 11, nylon 12, nylon 66, nylon 612, polyethylene, thermoplastic polyurethane, polypropylene, polyester, polycarbonate, polyether ketone, polyacrylate, polystyrene, polylactic acid, acrylonitrile butadiene styrene, or a mixture or copolymer thereof. In a certain example, the polymeric build material in the conductive element can be the same material as the nonconductive polymeric build material.

In another example, a method of making a three-dimensional printed article can include iteratively applying individual build material layers of polymer particles to a powder bed. A fusing agent can be selectively jetted onto the individual build material layers, based on a three-dimensional object model. The fusing agent can include water and a radiation absorber. A conductive agent can also be selectively jetted onto the individual build material layers, based on the three-dimensional object model, to form a conductive element. The powder bed can be exposed to energy to selectively fuse the polymer particles in contact with the radiation absorber at individual build material layers to form the three-dimensional printed article. The conductive element can be heated by running an electric current through the conductive element, thereby heating an adjacent portion of the three-dimensional printed article to a temperature sufficient to change a physical property of the polymeric build material of the adjacent portion. In certain examples, the physical property can be tensile strength, elasticity, density, surface roughness, abrasion resistance, rebound, compression, porosity, elongation, hardness, or a combination thereof. In further examples, the radiation absorber can be carbon black, a near-infrared absorbing dye, a near-infrared absorbing pigment, a tungsten bronze, a molybdenum bronze, metal nanoparticles, a conjugated polymer, or a combinations thereof.

The present disclosure also extends to systems for three-dimensional printing. In one example a three-dimensional printing system can include a powder build material, a fusing agent to apply to the powder build material, and a conductive agent to apply to the powder build material to form a three-dimensional printed conductive element. The powder build material can include polymer particles. The fusing agent can include water and a radiation absorber. The conductive agent can include a conductive material. The system can also include an electric current supply to apply an electric current across the three-dimensional printed conductive element. In further examples, the electric current supply can include an inductive source and the conductive agent can include an inductively responsive material.

A variety of three-dimensional (3D) printing processes use polymeric build materials. Non-limiting examples of such process include fused deposition modelling, selective laser melting, stereolithography, digital light processing, binder jetting, and others. One specific example is the HP Multi Jet Fusion 3D® printing process. In this process, a polymer powder can be used as the build material. Individual particles of polymer powder are fused together to form a final printed article. Other processes can use other polymeric build materials, such as polymer filament used in fused deposition modelling and liquid resins used in stereolithography. In the case of fused deposition modeling, a polymer filament can be melted and extruded from a print nozzle to deposition layers of a printed article. In the case of stereolithography, ultraviolet light can be applied to a liquid resin to selectively cure specific areas of the resin to form layers of the printed article.

In many cases, 3D printed articles can be inferior in some aspects compared to objects manufactured using other process like molding or machining. For example, 3D printed articles may be weaker than molded or machined articles, due to the particular properties of the polymer used as a build material and/or as a side effect of the 3D printing process. In another example, 3D printed articles can have a less appealing surface appearance and texture, with visible layer lines or rough surfaces cause by the particular 3D printing process used.

The present disclosure describes methods of making 3D printed articles that include a 3D printed conductive element. An electric current can be passed through the conductive element to cause the conductive element to heat up. By heating the conductive element to a sufficient temperature, a property of the surrounding polymer build material can be modified. For example, the polymer build material may be softened or melted by the heating. In a certain example, the shape of the 3D printed article can be change by softening or melting part of the article in this way and then bending, stretching, or otherwise modifying the shape of the article at the melted portion. In another specific example, the 3D printed article can include build material that is incompletely fused. The heat from the conductive element can cause the surrounding polymer build material to melt, and the build material can then cool and become more fully fused to increase the density of the polymer. In some cases, heating and cooling can increase the strength of the polymer. The surface texture and appearance of a 3D printed article can also be modified. A conductive element can be formed close to a surface of the 3D printed article. Heating the conductive element can cause the polymer at the surface to melt. The polymer can then cool and harden to form a smoother surface. In some examples, conductive elements can be positioned to form a specific pattern of smooth areas on the surface, while areas of the surface that are not sufficiently close to the conductive elements can retain the original surface texture. In other examples, conductive elements can be positioned near all surfaces of the 3D printed article so that heating the conductive elements forms a uniform, smooth surface over the article.

Many 3D printing processes can involve a large number of parameters that can be adjusted to affect the printing process and the final printed article. For the specific example of HP Multi Jet Fusion 3D® printing, these parameters may include the powder build material composition, particle size distribution, build material preheating temperature, layer height, concentration of fusing agents, amount of fusing agent jetted onto the powder build material, amount of heating, cooling time between layers, use of detailing agents, and many other parameters. Other 3D printing processes can have additional parameters to adjust. When these parameters are not set correctly, the printing process can produce a lower quality 3D printed article, or the print can fail entirely. In some cases, it can be difficult to select values for all the parameters of the printing process that will allow for printing a high-quality 3D printed article.

The 3D printed conductive elements described herein can provide additional flexibility to produce high-quality 3D printed parts while allowing other printing parameters to be adjusted over a broad range of values. For example, in some cases printing a strong, highly dense article may be desired. This might be achieved by using a high amount of heat to thoroughly melt the build material to make a dense printed article. However, these parameters can conflict with other parameters and other desired properties of the 3D printed article. In the HP Multi Jet Fusion 3D® printing process, for example, using high heat to melt the powder build material can potentially result in overheating and slumping or sagging of the layer being heated, so that the layer might sink down into lower layers and create an uneven top surface. This can cause a misshapen 3D printed article or even cause the printing process to fail. Overheating the printed article can also cause surrounding powder build material particles to fuse slightly and become stuck to the surface of the 3D printed article, which can create an undesirable rough and uneven surface.

In contrast, using the methods described herein, a 3D printed article can be printed with more moderate heat to produce a 3D printed article that is less dense. A conductive element can be formed in the 3D printed article as described herein. An electric current can be passed through the conductive element to heat the conductive element and cause the surround polymer to melt and then re-harden with a higher density. Thus, the final 3D printed article can be dense and strong without the unwanted side effects of using higher heat during the initial 3D printing process. In addition to this example, a variety of other situations can occur in which the use of 3D printed conductive elements as described herein can be useful and can provide extra flexibility for 3D printing processes.

In further examples, heating a 3D printed conductive element by passing electric current through the conductive element can modify properties of the conductive element itself. For example, a conductive element that includes conductive particles can be heated to further fuse the conductive particles and reduce the overall electric resistance of the conductive element. In this way, the functioning of the conductive element itself can be modified and the conductive element may be further used to serve some additional purpose other than heating, such as being a part of circuit or other device. Accordingly, the methods and systems described herein can be used for a variety of applications to modify properties of 3D printed articles.

Methods of Making Three-Dimensional Printed Articles

Generally, methods of making three-dimensional printed articles as described herein can include printing a conductive element and printing an adjacent portion in contact with the conductive element. The conductive element can be heated by running an electric current through the conductive element, and this can heat the adjacent portion to a temperature sufficient to change a physical property of the polymer in the adjacent portion. More particularly, the conductive element can include a composite of a conductive material with a polymeric build material. The adjacent portion can include a nonconductive build material, which may be the same polymeric build material is in the conductive element or a different polymeric material.

Figure 1:
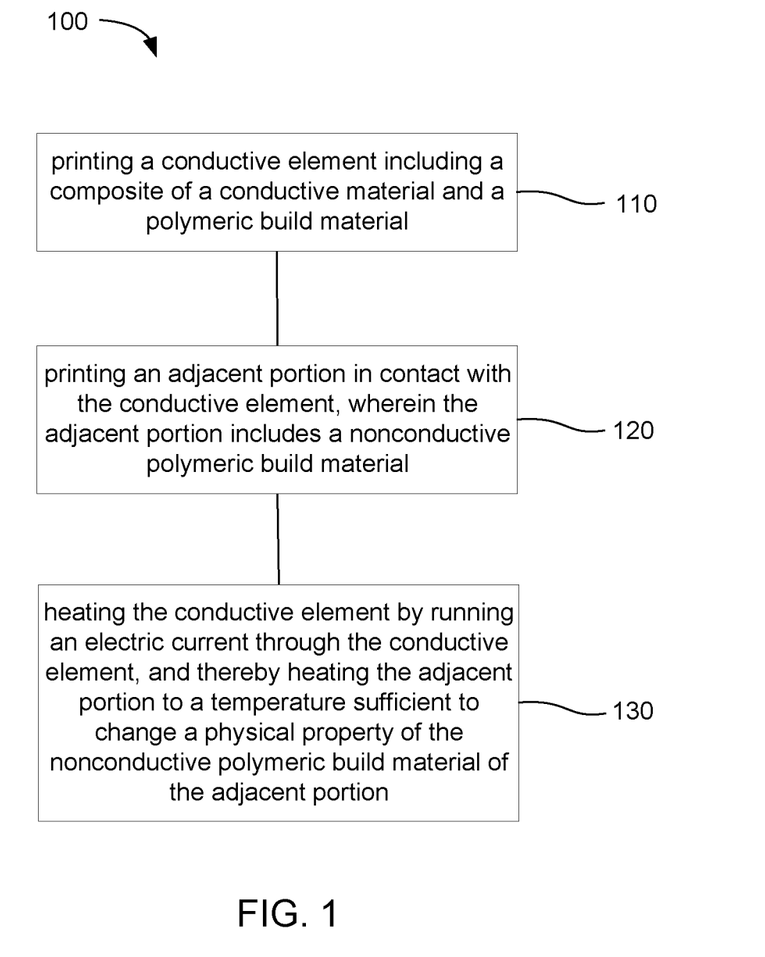
FIG. 1 is a flowchart illustrating an example method of making a three-dimensional printed article in accordance with examples of the present disclosure.

FIG. 1 is a flowchart illustrating an example method 100 of making a three-dimensional printed article in accordance with examples of the present disclosure. The method includes: printing a conductive element including a composite of a conductive material and a polymeric build material 110; printing an adjacent portion in contact with the conductive element, wherein the adjacent portion includes a nonconductive polymeric build material 120; and heating the conductive element by running an electric current through the conductive element, and thereby heating the adjacent portion to a temperature sufficient to change a physical property of the nonconductive polymeric build material of the adjacent portion 130.

The printing of the conductive element and the adjacent portion can be performed by any suitable 3D printing process. Printing the remainder of the 3D printed article, including any portions that are not adjacent to the conductive element, can also performed using the same 3D printing processes. Non-limiting examples of 3D printing processes include fused deposition modelling, selective laser melting, stereolithography, digital light processing, binder jetting, jet fusion, and others. Generally, any 3D printing process that utilizes a polymeric build material and can form a conductive element as described above can be used.

The conductive element can be made up of a composite material including a conductive material and a polymeric build material. In some examples, the conductive material can be in the form of conductive particles. The conductive particles can be present in a concentration sufficient that a conductive pathway is formed by conductive particles in contact one with another or near enough to conduct an electric current. In further examples, the conductive material can be a network of fused or partially fused particles. In still further examples, the conductive material can be continuous network of material such as a network of conductive polymer. Combinations of these materials can also be used. In certain examples, the conductive material can include silver particles, copper particles, gold particles, nickel particles, carbon particles, or a combination thereof. The particles can be separate, touching, fused, or partially fused together in various examples. The conductive material can be embedded in or mixed with a polymeric build material.

The adjacent portion in contact with the conductive element can be made of a nonconductive polymeric build material. The nonconductive polymeric build material can have a property or multiple properties that can be changed by heating the conductive element. In certain examples, the nonconductive polymeric build material can be a thermoplastic material. As used herein, "thermoplastic" refers to a material that become pliable upon heating and then harden when cooled. In some examples, the thermoplastic material can have a melting point, which is a temperature sufficiently high to melt the material into a flowable liquid. Non-limiting examples of suitable nonconductive polymeric build materials can include nylon 6, nylon 9, nylon 11, nylon 12, nylon 66, nylon 612, polyethylene, thermoplastic polyurethane, polypropylene, polyester, polycarbonate, polyether ketone, polyacrylate, polystyrene, polylactic acid, acrylonitrile butadiene styrene, mixtures and copolymers thereof, and others. In some examples, the nonconductive polymeric build material of the adjacent portion can be the same material as the polymeric build material in the conductive element.

Figure 2:
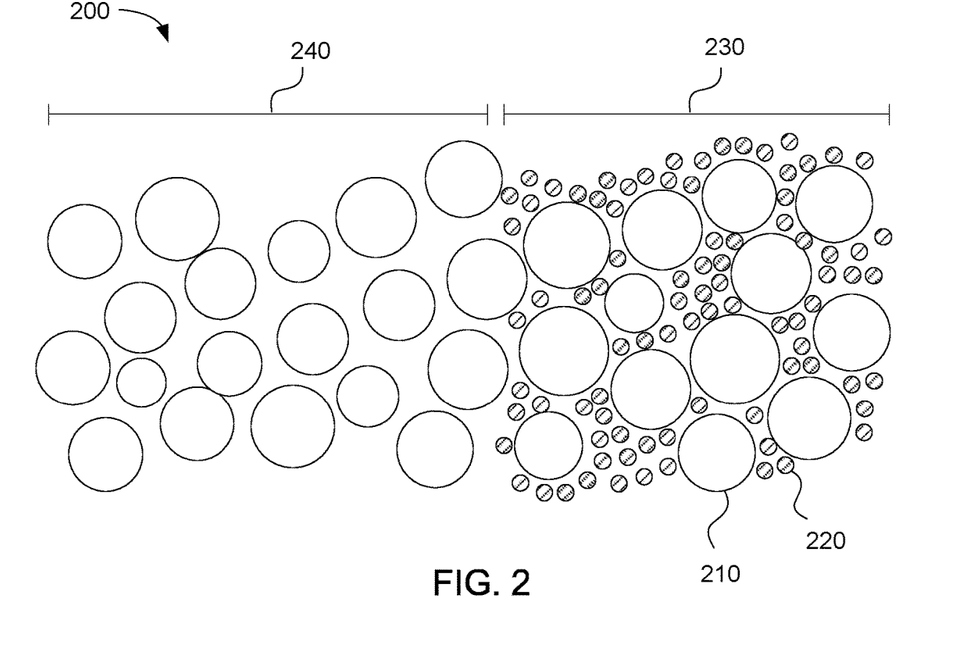
FIG. 2 is a schematic cross sectional view of an example build material layer in accordance with examples of the present disclosure.
Figure 3:
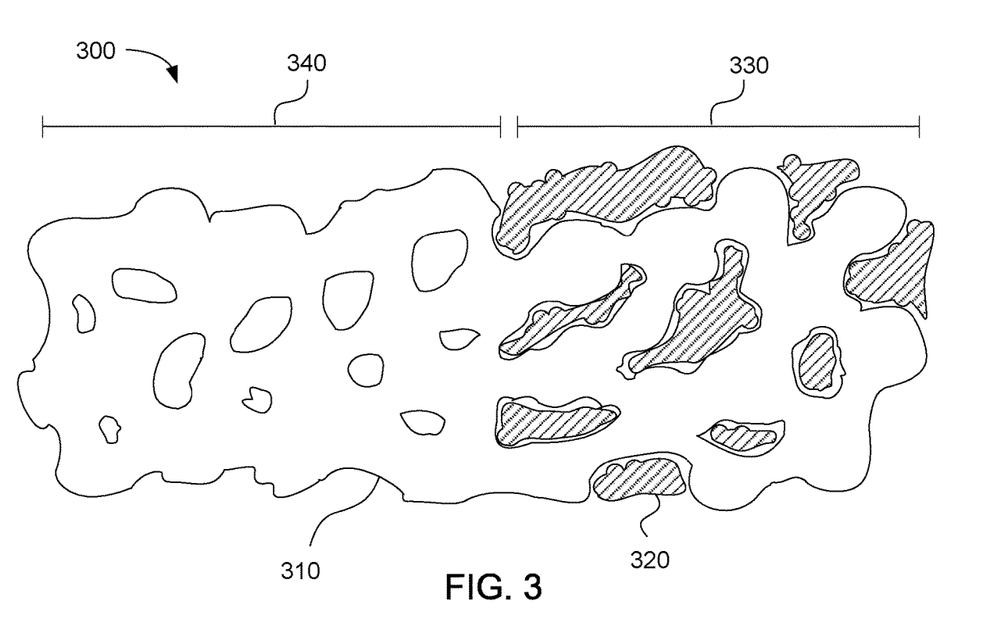
FIG. 3 is a schematic cross sectional view of a fused build material layer in accordance with examples of the present disclosure.

To further illustrate the 3D printed conductive element and adjacent portion, FIG. 2 shows a close up of a portion of an example build material layer 200 in accordance with examples of the present disclosure. The build material layer includes polymeric build material particles 210 and conductive particles 220. The conductive particles are positioned in a first portion 230 of the layer that is to become the conductive element. An adjacent portion 240 is made up of polymer particles without any conductive particles. In this particle example, the build material layer can be heated to fuse the particles together to form a fused layer 300 as shown in FIG. 3. The fused layer includes a conductive element 330 made up of a composite of conductive material 320 and polymeric build material 310. The conductive particles are fused or sintered together to form a network of conductive material embedded in the fused polymeric material. The adjacent portion 340 is made up of fused particles of polymeric build material without any conductive material.

A more specific method of making a three-dimensional printed article can involve jetting a fusing agent and a conductive agent onto a powder bed. The fusing agent can be a fluid that includes a radiation absorber capable of absorbing radiation such as infrared radiation and converting the radiation energy to heat. After the fusing agent is jetted onto the powder bed, the powder bed can be irradiated. The radiation absorber can generate heat in the areas where the fusing agent was jetted, causing the powder bed build material to become fused together in those areas. A conductive element can be formed by jetting a conductive agent on a portion of the powder bed where the conductive element is to be formed.

Figure 4:
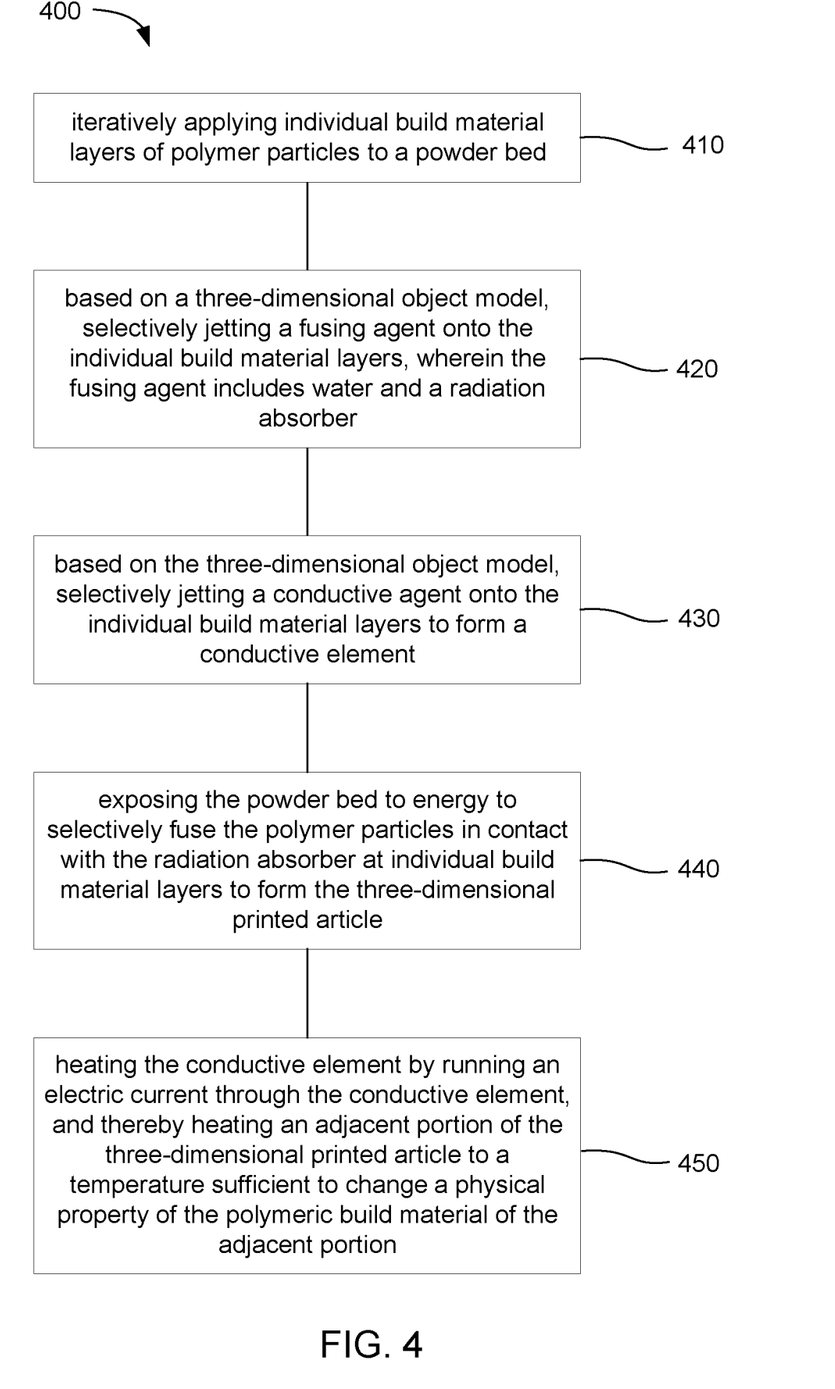
FIG. 4 is a flowchart illustration another example method of making a three-dimensional printed article in accordance with examples of the present disclosure.

FIG. 4 is a flowchart illustrating an example method of making a three-dimensional printed article 400 of this type. This method includes: iteratively applying individual build material layers of polymer particles to a powder bed 410; based on a three-dimensional object model, selectively jetting a fusing agent onto the individual build material layers, wherein the fusing agent includes water and a radiation absorber 420; based on the three-dimensional object model, selectively jetting a conductive agent onto the individual build material layers to form a conductive element 430; exposing the powder bed to energy to selectively fuse the polymer particles in contact with the radiation absorber at individual build material layers to form the three-dimensional printed article 440; and heating the conductive element by running an electric current through the conductive element, and thereby heating an adjacent portion of the three-dimensional printed article to a temperature sufficient to change a physical property of the polymeric build material of the adjacent portion 450.

As mentioned above, the 3D printed article can be formed by jetting a fusing agent onto layers of powder bed build material according to a 3D object model. 3D object models can in some examples be created using computer aided design (CAD) software. 3D object models can be stored in any suitable file format. In some examples, a 3D printed article as described herein can be based on a single 3D object model. The 3D object model can define the three-dimensional shape of the article and the three-dimensional shape of conductive elements to be formed in the 3D printed article. In other examples, the article can be defined by a first 3D object model and the conductive element or elements can be defined by a second 3D object model. Other information may also be included, such as structures to be formed of additional different materials or color data for printing the article with various colors at different locations on the article. The 3D object model may also include features or materials specifically related to jetting fluids on layers of powder bed material, such as the desired amount of fluid to be applied to a given area. This information may be in the form of a droplet saturation, for example, which can instruct a 3D printing system to jet a certain number of droplets of fluid into a specific area. This can allow the 3D printing system to finely control radiation absorption, cooling, color saturation, concentration of conductive material, and so on. All this information can be contained in a single 3D object file or a combination of multiple files. The 3D printed article can be made based on the 3D object model. As used herein, "based on the 3D object model" can refer to printing using a single 3D object model file or a combination of multiple 3D object models that together define the article. In certain examples, software can be used to convert a 3D object model to instructions for a 3D printer to form the article by building up individual layers of build material.

In an example of the 3D printing process, a thin layer of polymer powder can be spread on a bed to form a powder bed. At the beginning of the process, the powder bed can be empty because no polymer particles have been spread at that point. For the first layer, the polymer particles can be spread onto an empty build platform. The build platform can be a flat surface made of a material sufficient to withstand the heating conditions of the 3D printing process, such as a metal. Thus, "applying individual build material layers of polymer particles to a powder bed" includes spreading polymer particles onto the empty build platform for the first layer. In other examples, a number of initial layers of polymer powder can be spread before the printing begins. These "blank" layers of powder bed material can in some examples number from about 10 to about 500, from about 10 to about 200, or from about 10 to about 100. In some cases, spreading multiple layers of powder before beginning the print can increase temperature uniformity of the 3D printed article. A printing head, such as an inkjet print head, can then be used to print a fusing agent including a radiation absorber over portions of the powder bed corresponding to a thin layer of the 3D article to be formed. Then the bed can be exposed to electromagnetic energy, e.g., typically the entire bed. The electromagnetic energy can include light, infrared radiation, and so on. The radiation absorber can absorb more energy from the electromagnetic energy than the unprinted powder. The absorbed light energy can be converted to thermal energy, causing the printed portions of the powder to soften and fuse together into a formed layer. After the first layer is formed, a new thin layer of polymer powder can be spread over the powder bed and the process can be repeated to form additional layers until a complete 3D article is printed. Thus, "applying individual build material layers of polymer particles to a powder bed" also includes spreading layers of polymer particles over the loose particles and fused layers beneath the new layer of polymer particles.

In some examples, a detailing agent can be used together with the fusing agent. The detailing agent can be a fluid that reduces the maximum temperature of the polymer powder on which the detailing agent is printed. In particular, the maximum temperature reached by the powder during exposure to electromagnetic energy can be less in the areas where the detailing agent is applied. In certain examples, the detailing agent can include a solvent that evaporates from the polymer powder to evaporatively cool the polymer powder. The detailing agent can be printed in areas of the powder bed where fusing is not desired. In particular examples, the detailing agent can be printed along the edges of areas where the fusing agent is printed. This can give the fused layer a clean, defined edge where the fused polymer particles end and the adjacent polymer particles remain unfused. In other examples, the detailing agent can be printed in the same area where the fusible agent is printed to control the temperature of the area to be fused. In certain examples, some areas to be fused can tend to overheat, especially in central areas of large fused sections. To control the temperature and avoid overheating (which can lead to melting and slumping of the build material), the detailing agent can be applied to these areas. The materials and agents used in this type of 3D printing process are described in more detail below.

Powder Bed Material

In certain examples, the powder bed material can include polymer particles having a variety of shapes, such as substantially spherical particles or irregularly-shaped particles. In some examples, the polymer powder can be capable of being formed into 3D printed objects with a resolution of about 20 µm to about 100 µm, about 30 µm to about 90 µm, or about 40 µm to about 80 µm. As used herein, "resolution" refers to the size of the smallest feature that can be formed on a 3D printed object. The polymer powder can form layers from about 20 µm to about 100 µm thick, allowing the fused layers of the printed part to have roughly the same thickness. This can provide a resolution in the z-axis (i.e., depth) direction of about 20 µm to about 100 µm. The polymer powder can also have a sufficiently small particle size and sufficiently regular particle shape to provide about 20 µm to about 100 µm resolution along the x-axis and y-axis (i.e., the axes parallel to the top surface of the powder bed). For example, the polymer powder can have an average particle size from about 20 µm to about 100 µm. In other examples, the average particle size can be from about 20 µm to about 50 µm. Other resolutions along these axes can be from about 30 µm to about 90 µm or from 40 µm to about 80 µm.

The thermoplastic polymer powder can have a melting or softening point from about 70° C. to about 350° C. In further examples, the polymer can have a melting or softening point from about 150° C. to about 200° C. A variety of thermoplastic polymers with melting points or softening points in these ranges can be used. For example, the polymer powder can be nylon 6 powder, nylon 9 powder, nylon 11 powder, nylon 12 powder, nylon 66 powder, nylon 612 powder, polyethylene powder, wax, thermoplastic polyurethane powder, acrylonitrile butadiene styrene powder, amorphous polyamide powder, polymethylmethacrylate powder, ethylene-vinyl acetate powder, polyarylate powder, silicone rubber, polypropylene powder, polyester powder, polycarbonate powder, copolymers of polycarbonate with acrylonitrile butadiene styrene, copolymers of polycarbonate with polyethylene terephthalate polyether ketone powder, polyacrylate powder, polystyrene powder, or mixtures thereof. In a specific example, the polymer powder can be nylon 12, which can have a melting point from about 175° C. to about 200° C. In another specific example, the polymer powder can be thermoplastic polyurethane.

The thermoplastic polymer particles can also in some cases be blended with a filler. The filler can include inorganic particles such as alumina, silica, fibers, carbon nanotubes, or combinations thereof. When the thermoplastic polymer particles fuse together, the filler particles can become embedded in the polymer, forming a composite material. In some examples, the filler can include a free-flow agent, anti-caking agent, or the like. Such agents can prevent packing of the powder particles, coat the powder particles and smooth edges to reduce inter-particle friction, and/or absorb moisture. In some examples, a weight ratio of thermoplastic polymer particles to filler particles can be from about 10:1 to about 1:2 or from about 5:1 to about 1:1.

Fusing Agents

The methods for making three-dimensional printed articles described herein can include jetting a fusing agent onto the polymer build material. The fusing agent can include a radiation absorber that can absorb radiant energy and convert the energy to heat. In certain examples, the fusing agent can be used with a powder bed material in a particular 3D printing process. A thin layer of powder bed material can be formed, and then the fusing agent can be selectively applied to areas of the powder bed material that are desired to be consolidated to become part of the solid 3D printed object. The fusing agent can be applied, for example, by printing such as with a fluid jet printhead. Fluid jet printheads can jet the fusing agent in a similar way to an inkjet printhead jetting ink. Accordingly, the fusing agent can be applied with great precision to certain areas of the powder bed material that are desired to form a layer of the final 3D printed object. After applying the fusing agent, the powder bed material can be irradiated with radiant energy. The radiation absorber from the fusing agent can absorb this energy and convert it to heat, thereby heating any polymer particles in contact with the radiation absorber. An appropriate amount of radiant energy can be applied so that the area of the powder bed material that was printed with the fusing agent heats up enough to melt the polymer particles so that the particles consolidate into a solid layer, while the powder bed material that was not printed with the fusing agent remains as a loose powder with separate particles.

In some examples, the amount of radiant energy applied, the amount fusing agent applied to the powder bed, the concentration of radiation absorber in the fusing agent, and the preheating temperature of the powder bed (i.e., the temperature of the powder bed material prior to printing the fusing agent and irradiating) can be tuned to ensure that the portions of the powder bed printed with the fusing agent will be fused to form a solid layer and the unprinted portions of the powder bed will remain a loose powder.

Generally, the process of forming a single layer by applying fusing agent and irradiating the powder bed can be repeated with additional layers of fresh powder bed material to form additional layers of the 3D printed object, thereby building up the final object one layer at a time. In this process, the powder bed material surrounding the 3D printed object can act as a support material for the object. When the 3D printing is complete, the object can be removed from the powder bed and any loose powder on the object can be removed.

Accordingly, in some examples, the fusing agent can include a radiation absorber that is capable of absorbing electromagnetic radiation to produce heat. The radiation absorber can be colored or colorless. In various examples, the radiation absorber can be glass fiber, titanium dioxide, clay, mica, talc, barium sulfate, calcium carbonate, a near-infrared absorbing dye, a near-infrared absorbing pigment, a conjugated polymer, a dispersant, or combinations thereof. Examples of near-infrared absorbing dyes include aminium dyes, tetraaryldiamine dyes, cyanine dyes, pthalocyanine dyes, dithiolene dyes, and others. In further examples, radiation absorber can be a near-infrared absorbing conjugated polymer such as poly(3,4-ethylenedioxythiophene)-poly(styrenesulfonate) (PEDOT:PSS), a polythiophene, poly(p-phenylene sulfide), a polyaniline, a poly(pyrrole), a poly(acetylene), poly(p-phenylene vinylene), polyparaphenylene, or combinations thereof. As used herein, "conjugated" refers to alternating double and single bonds between atoms in a molecule. Thus, "conjugated polymer" refers to a polymer that has a backbone with alternating double and single bonds. In many cases, the radiation absorber can have a peak absorption wavelength in the range of about 800 nm to about 1400 nm.

A variety of near-infrared pigments can also be used. Non-limiting examples can include phosphates having a variety of counterions such as copper, zinc, iron, magnesium, calcium, strontium, the like, and combinations thereof. Non-limiting specific examples of phosphates can include $M_2P_2O_7$, $M_4P_2O_9$, $M_5P_2O_{10}$, $M_3(PO_4)_2$, $M(PO_3)_2$, $M_2P_4O_{12}$, and combinations thereof, where M represents a counterion having an oxidation state of +2, such as those listed above or a combination thereof. For example, $M_2P_2O_7$ can include compounds such as $Cu_2P_2O_7$, $Cu/MgP_2O_7$, $Cu/ZnP_2O_7$, or any other suitable combination of counterions. It is noted that the phosphates described herein are not limited to counterions having a +2 oxidation state. Other phosphate counterions can also be used to prepare other suitable near-infrared pigments.

Additional near-infrared pigments can include silicates. Silicates can have the same or similar counterions as phosphates. One non-limiting example can include $M_2SiO_4$, $M_2Si_2O_6$, and other silicates where M is a counterion having an oxidation state of +2. For example, the silicate $M_2Si_2O_6$ can include $Mg_2Si_2O_6$, $Mg/CaSi_2O_6$, $MgCuSi_2O_6$, $Cu_2Si_2O_6$, $Cu/ZnSi_2O_6$, or other suitable combination of counterions. It is noted that the silicates described herein are not limited to counterions having a +2 oxidation state. Other silicate counterions can also be used to prepare other suitable near-infrared pigments.

In further examples, the radiation absorber can include a metal dithiolene complex. Transition metal dithiolene complexes can exhibit a strong absorption band in the 600 nm to 1600 nm region of the electromagnetic spectrum. In some examples, the central metal atom can be any metal that can form square planer complexes. Non-limiting specific examples include complexes based on nickel, palladium, and platinum.

A dispersant can be included in the fusing agent in some examples. Dispersants can help disperse the radiation absorbing pigments described above. In some examples, the dispersant itself can also absorb radiation. Non-limiting examples of dispersants that can be included as a radiation absorber, either alone or together with a pigment, can include polyoxyethylene glycol octylphenol ethers, ethoxylated aliphatic alcohols, carboxylic esters, polyethylene glycol ester, anhydrosorbitol ester, carboxylic amide, polyoxyethylene fatty acid amide, poly (ethylene glycol) p-isooctylphenyl ether, sodium polyacrylate, and combinations thereof.

The amount of radiation absorber in the fusing agent can vary depending on the type of radiation absorber. In some examples, the concentration of radiation absorber in the fusing agent can be from about 0.1 wt % to about 20 wt %. In one example, the concentration of radiation absorber in the fusing agent can be from about 0.1 wt % to about 15 wt %. In another example, the concentration can be from about 0.1 wt % to about 8 wt %. In yet another example, the concentration can be from about 0.5 wt % to about 2 wt %. In a particular example, the concentration can be from about 0.5 wt % to about 1.2 wt %. In one example, the radiation absorber can have a concentration in the fusing agent such that after the fusing agent is jetted onto the polymer powder, the amount of radiation absorber in the polymer powder can be from about 0.0003 wt % to about 10 wt %, or from about 0.005 wt % to about 5 wt %, with respect to the weight of the polymer powder.

In some examples, the fusing agent can be jetted onto the polymer powder build material using a fluid jetting device, such as inkjet printing architecture. Accordingly, in some examples, the fusing agent can be formulated to give the fusing agent good jetting performance. Ingredients that can be included in the fusing agent to provide good jetting performance can include a liquid vehicle. Thermal jetting can function by heating the fusing agent to form a vapor bubble that displaces fluid around the bubble, and thereby forces a droplet of fluid out of a jet nozzle. Thus, in some examples the liquid vehicle can include a sufficient amount of an evaporating liquid that can form vapor bubbles when heated. The evaporating liquid can be a solvent such as water, an alcohol, an ether, or a combination thereof.

In some examples, the liquid vehicle formulation can include a co-solvent or co-solvents present in total at from about 1 wt % to about 50 wt %, depending on the jetting architecture. Further, a non-ionic, cationic, and/or anionic surfactant can be present, ranging from about 0.01 wt % to about 5 wt %. In one example, the surfactant can be present in an amount from about 1 wt % to about 5 wt %. The liquid vehicle can include dispersants in an amount from about 0.5 wt % to about 3 wt %. The balance of the formulation can be purified water, and/or other vehicle components such as biocides, viscosity modifiers, materials for pH adjustment, sequestering agents, preservatives, and the like. In one example, the liquid vehicle can be predominantly water.

In some examples, a water-dispersible or water-soluble radiation absorber can be used with an aqueous vehicle. Because the radiation absorber is dispersible or soluble in water, an organic co-solvent may not be present, as it may not be included to solubilize the radiation absorber. Therefore, in some examples the fluids can be substantially free of organic solvent, e.g., predominantly water. However, in other examples a co-solvent can be used to help disperse other dyes or pigments, or enhance the jetting properties of the respective fluids. In still further examples, a non-aqueous vehicle can be used with an organic-soluble or organic-dispersible fusing agent.

In certain examples, a high boiling point co-solvent can be included in the fusing agent. The high boiling point co-solvent can be an organic co-solvent that boils at a temperature higher than the temperature of the powder bed during printing. In some examples, the high boiling point co-solvent can have a boiling point above about 250° C. In still further examples, the high boiling point co-solvent can be present in the fusing agent at a concentration from about 1 wt % to about 4 wt %.

Classes of co-solvents that can be used can include organic co-solvents including aliphatic alcohols, aromatic alcohols, diols, glycol ethers, polyglycol ethers, caprolactams, formamides, acetamides, and long chain alcohols. Examples of such compounds include 1-aliphatic alcohols, secondary aliphatic alcohols, 1,2-alcohols, 1,3-alcohols, 1,5-alcohols, ethylene glycol alkyl ethers, propylene glycol alkyl ethers, higher homologs ($C_6$-$C_{12}$) of polyethylene glycol alkyl ethers, N-alkyl caprolactams, unsubstituted caprolactams, both substituted and unsubstituted formamides, both substituted and unsubstituted acetamides, and the like. Specific examples of solvents that can be used include, but are not limited to, 2-pyrrolidinone, N-methylpyrrolidone, 2-hydroxyethyl-2-pyrrolidone, 2-methyl-1,3-propanediol, tetraethylene glycol, 1,6-hexanediol, 1,5-hexanediol and 1,5-pentanediol.

Regarding the surfactant that may be present, a surfactant or surfactants can be used, such as alkyl polyethylene oxides, alkyl phenyl polyethylene oxides, polyethylene oxide block copolymers, acetylenic polyethylene oxides, polyethylene oxide (di)esters, polyethylene oxide amines, protonated polyethylene oxide amines, protonated polyethylene oxide amides, dimethicone copolyols, substituted amine oxides, and the like. The amount of surfactant added to the fusing agent may range from about 0.01 wt % to about 20 wt %. Suitable surfactants can include, but are not limited to, liponic esters such as Tergitol™ 15-S-12, Tergitol™ 15-S-7 available from Dow Chemical Company (Michigan), LEG-1 and LEG-7; Triton™ X-100; Triton™ X-405 available from Dow Chemical Company (Michigan); and sodium dodecylsulfate.

Various other additives can be employed to enhance certain properties of the fusing agent for specific applications. Examples of these additives are those added to inhibit the growth of harmful microorganisms. These additives may be biocides, fungicides, and other microbial agents, which can be used in various formulations. Examples of suitable microbial agents include, but are not limited to, NUOSEPT® (Nudex, Inc., New Jersey), UCARCIDE™ (Union carbide Corp., Texas), VANCIDE® (R.T. Vanderbilt Co., Connecticut), PROXEL® (ICI Americas, New Jersey), and combinations thereof.

Sequestering agents, such as EDTA (ethylene diamine tetra acetic acid), may be included to eliminate the deleterious effects of heavy metal impurities, and buffer solutions may be used to control the pH of the fluid. From about 0.01 wt % to about 2 wt %, for example, can be used. Viscosity modifiers and buffers may also be present, as well as other additives to modify properties of the fluid as desired. Such additives can be present at from about 0.01 wt % to about 20 wt %.

Conductive Agents

The methods of making three-dimensional printed articles described herein can also involve jetting a conductive agent onto the power bed material. The conductive agent can be applied in a similar way to the fusing agent described above. The conductive agent can be selectively applied to areas of the powder bed material where conductive elements are to be formed. In some examples, the conductive agent can have any of the ingredients described above in the fusing agent, such as liquid vehicles, dispersants, and so on. The conductive agent can also include a conductive material for forming the conductive elements in the 3D printed article. In some examples, the conductive material can include electrically conductive polymers, metals, carbon allotropes, the like, and combinations thereof. Carbon allotropes can include single-walled carbon nanotubes, multi-walled carbon nanotubes, graphene, buckyballs, graphite, carbon black, etc., and combinations thereof. In certain examples, the conductive material can include silver particles, copper particles, gold particles, nickel particles, carbon particles, or a combination thereof.

In further examples, the conductive agent can include a transition metal. In some examples, the transition metal can be in the form of elemental transition metal particles. The elemental transition metal particles can include, for example, silver particles, copper particles, gold particles, platinum particles, palladium particles, chromium particles, nickel particles, zinc particles, or combinations thereof. The particles can also include alloys of more than one transition metal, such as Au—Ag, Ag—Cu, Ag—Ni, Au—Cu, Au—Ni, Au—Ag—Cu, or Au—Ag—Pd.

In certain examples, other non-transition metals can be included in addition to the transition metal. The non-transition metals can include lead, tin, bismuth, indium, gallium, and others. In some examples, soldering alloys can be included. The soldering alloys can include alloys of lead, tin, bismuth, indium, zinc, gallium, silver, copper, in various combinations. In certain examples, such soldering alloys can be printed in locations that are to be used as soldering connections for printed electrical components. The soldering alloys can be formulated to have low melting temperatures useful for soldering, such as less than 230° C.

In further examples, the elemental transition metal particles can be nanoparticles having an average particle size from 10 nm to 200 nm. In more specific examples, the elemental transition metal particles can have an average particle size from 30 nm to 70 nm. As metal particles are reduced in size, the temperature at which the particles are capable of being sintered can also be reduced. Therefore, using elemental transition metal nanoparticles in the conductive agent can allow the particles to sinter and form a conductive matrix of sintered nanoparticles at relatively low temperatures. For example, the elemental transition metal particles in the conductive agent can be capable of being sintered at or below the temperature reached during curing in the 3D printing process. In a further example, the thermoplastic polymer powder bed can be heated to a preheat temperature during the printing process, and the elemental transition metal particles can be capable of being sintered at or below the preheat temperature. In still further examples, the elemental transition metal particles can be capable of being sintered at a temperature from 20° C. to 350° C. As used herein, the temperature at which the elemental transition metal particles are capable of being sintered refers to the lowest temperature at which the particles will become sintered together, forming a conductive matrix of sintered particles. It is understood that temperatures above this lowest temperature will also cause the particles to become sintered.

In additional examples of the conductive agent, the transition metal can be in the form of elemental transition metal particles that are stabilized by a dispersing agent at surfaces of the particles. The dispersing agent can include ligands that passivate the surface of the particles. Suitable ligands can include a moiety that binds to the transition metal. Examples of such moieties can include sulfonic acid, phosphonic acid, carboxylic acid, dithiocarboxylic acid, phosphonate, sulfonate, thiol, carboxylate, dithiocarboxylate, amine, and others. In some cases, the dispersing agent can contain an alkyl group having from 3-20 carbon atoms, with one of the above moieties at an end of the alkyl chain. In certain examples, the dispersing agent can be an alkylamine, alkylthiol, or combinations thereof. In further examples, the dispersing agent can be a polymeric dispersing agent, such as polyvinylpyrrolidone (PVP), polyvinylalcohol (PVA), polymethylvinylether, poly(acrylic acid) (PAA), nonionic surfactants, polymeric chelating agents, and others. The dispersing agent can bind to the surfaces of the elemental transition metal particles through chemical and/or physical attachment. Chemical bonding can include a covalent bond, hydrogen bond, coordination complex bond, ionic bond, or combinations thereof. Physical attachment can include attachment through van der Waal's forces, dipole-dipole interactions, or a combination thereof.

In further examples, the conductive agent can include a transition metal in the form of a metal salt or metal oxide.

Under certain conditions, a transition metal salt or metal oxide in the conductive agent can form elemental transition metal particles in situ after being printed onto the thermoplastic polymer powder bed. The elemental transition metal particles thus formed can then be sintered together to form a conductive matrix. In some examples, a reducing agent can be reacted with the metal salt or metal oxide to produce elemental metal particles. In one example, a reducing agent can be underprinted onto the powder bed before the conductive agent. In another example, a reducing agent can be overprinted over the conductive agent. In either case, the reducing agent can be reacted with the metal salt or metal oxide to form elemental metal particles before the thermoplastic polymer particle layer is fused. Suitable reducing agents can include, for example, glucose, fructose, maltose, maltodextrin, trisodium citrate, ascorbic acid, sodium borohydride, ethylene glycol, 1,5-pentanediol, 1,2-propylene glycol, and others.

In other examples, the conductive agent can include a conductive polymer. Non-limiting examples of conductive polymers can include poly(3,4-ethylenedioxythiophene) (PEDOT), polyaniline (PANI), polythiophene, polypyrrole, etc., or a combination thereof. The level of conductivity of a conductive polymer can depend of the level of doping or oxidation of the conductive polymer. Thus, while many conductive polymers are used as semiconductors, they can be doped with conductive materials to increase their conductivity. Further, conductive polymers with low water solubility can be further functionalized with hydrophilic moieties to increase their water solubility. Thus, a large variety of conductive polymers, or combinations thereof, can be employed as conductive particles.

The concentration of conductive particles in the conductive agent can vary. However, higher conductive particle concentrations can tend to provide better conductivity due to a larger amount of conductive material being deposited on the powder bed. In some examples, the conductive agent can contain from about 5 wt % to about 50 wt % of conductive particles, with respect to the entire weight of the conductive agent. In further examples, the conductive agent can contain from about 10 wt % to about 30 wt % of conductive particles, with respect to the entire weight of the conductive agent.

The concentration of conductive particles that is present in the 3D printed conductive element after printing can depend on the concentration of conductive particles in the conductive agent and the amount of conductive agent that is applied to the build material. In some examples, the conductive agent can be applied to the polymeric build material in an amount sufficient such that the final 3D printed conductive element includes from about 1 vol % to about 30 vol % conductive material, based on the total volume of the 3D printed conductive element.

In some examples of the present disclosure, an activating agent can be used with the conductive agent. A variety of activating agents can be used. For example, activating agents can include halogen salts, acids, bases, various solvents, and combinations thereof. In one specific example, where the conductive agent includes a transition metal, the activating agent can include a halogen salt, such as sodium chloride, potassium chloride, potassium bromide, or potassium iodide, for example. The halogen salt can react with dispersing agents at the surfaces of transition metal particles to remove the dispersing agents from the particles. This can increase the sintering between the metal particles and increase the conductivity of the matrix formed of the sintered particles. The activating agent can be dispensed onto the powder bed before the conductive agent. When the conductive agent is printed over the activating agent, the transition metal particles can come into contact with the halogen salt in the activating agent. In alternate examples, the polymer powder can be pretreated with a halogen salt before being used in the 3D printing system. When the conductive agent is printed onto the powder bed, the transition metal particles in the conductive agent can come into contact with the halogen salt already present on the powder.

As one specific alternative example of an activating agent, the conductive polymer PEDOT can be activated with polystyrenesulfonate (PSS) or other suitable activating agent. Other conductive polymers can be activated with a variety of dopants, such as carbon allotropes, acids, bases, and the like. All such activating agents are considered within the scope of the current disclosure.

In further examples, the conductive agent can include an inductively responsive material. Inductively responsive materials can include any material that can be heated by an inductive power source without physical contact with the power source to pass electric current. Thus, the 3D printed conductive elements made using the conductive agent can also be heated inductively in some examples. The inductively responsive material can be the same material as the conductive materials described above, or an additional material. Some examples of inductively responsive materials can include ferrous materials and alloys thereof, magnetic materials, tungsten, tin, brass, aluminum, and others.

Detailing Agents

In further examples, methods of making 3D printed articles can include jetting a detailing agent onto the powder bed. The detailing agent can include a detailing compound. The detailing compound can be capable of reducing the temperature of the powder bed material onto which the detailing agent is applied. In some examples, the detailing agent can be printed around the edges of the portion of the powder that is printed with the fusing agent. The detailing agent can increase selectivity between the fused and unfused portions of the powder bed by reducing the temperature of the powder around the edges of the portion to be fused.

In some examples, the detailing compound can be a solvent that evaporates at the temperature of the powder bed. In some cases the powder bed can be preheated to a preheat temperature within about 10° C. to about 70° C. of the fusing temperature of the polymer powder. Depending on the type of polymer powder used, the preheat temperature can be in the range of about 90° C. to about 200° C. or more. Thus, the detailing compound can be a solvent that evaporates when it comes into contact with the powder bed at the preheat temperature, thereby cooling the printed portion of the powder bed through evaporative cooling. In certain examples, the detailing agent can include water, co-solvents, or combinations thereof. Non-limiting examples of co-solvents for use in the detailing agent can include xylene, methyl isobutyl ketone, 3-methoxy-3-methyl-1-butyl acetate, ethyl acetate, butyl acetate, propylene glycol monomethyl ether, ethylene glycol mono tert-butyl Ether, dipropylene glycol methyl ether, diethylene glycol butyl ether, ethylene glycol monobutyl ether, 3-Methoxy-3-Methyl-1-butanol, isobutyl alcohol, 1,4-butanediol, N, N-dimethyl acetamide, and combinations thereof. In some examples, the detailing agent can be mostly water. In a particular example, the detailing agent can be about 85 wt % water or more. In further examples, the detailing agent can be about 95 wt % water or more. In still further examples, the detailing agent can be substantially devoid of radiation absorbers. That is, in some examples, the detailing agent can be substantially devoid of ingredients that absorb enough energy from the light source to cause the powder to fuse. In certain examples, the detailing agent can include colorants such as dyes or pigments, but in small enough amounts that the colorants do not cause the powder printed with the detailing agent to fuse when exposed to the light source.

Changing Physical Properties

As explained above, the methods of making 3D printed articles described herein can include heating the conductive element by running an electric current through the conductive element. This heating can also heat the polymeric build material adjacent to the conductive element to the point that a physical property of the polymeric build material is changed. In some examples, this can include softening or melting the polymeric build material adjacent to the conductive element. In some examples, the changed physical property can refer to a property of the polymeric build material while it is heated and in a softened or melted state. In other examples, the changed physical property can refer to a property of the polymeric build after it has cooled and re-hardened. In many cases, the heating can cause multiple physical properties to change.

Non-limiting examples of physical properties that can be changed by the heating include tensile strength, elasticity, density, surface roughness, abrasion resistance, rebound, compression, porosity, elongation, hardness, or a combination thereof. For example, if the heating softens or melts the adjacent polymeric build material, then the polymeric build material can become much more elastic and have a lower tensile strength. In contrast, when the polymeric build material is melted and then cooled, the final material can have higher tensile strength than before the heating and cooling. Both of these property changes can be encompassed by the methods described herein.

In a certain example, the method can include heating the polymeric build material adjacent to the conductive element until the polymeric build material softens. The method can also include bending the 3D printed article at the softened portion. In this way, the 3D printed article can be bent or folded into a new shape. Bending the 3D printed article after printing can allow the 3D printed article to have a customized shape. In some examples, the 3D printed article can be fitted to a second article by customizing the shape of the 3D printed article. In certain examples, the 3D printed article may be a wearable article or a portion of a wearable article, and the 3D article can include conductive elements positioned to allow the 3D article to be bent to provide a custom fit for a wearer. In one such example, the 3D printed article can be a shoe or portion of a shoe, and the 3D printed article can be custom fit to the foot of a wearer by softening the polymeric build material at suitable locations and bending the 3D printed article to provide a custom fit. In another example, the 3D printed article can be a prosthetic device or portion of a prosthetic device that can be bent and custom fit to a wearer. A variety of other wearable articles can be made for custom fitting in this way, such as eyewear frames, helmets and other protective gear, and so on.

Figure 5A:
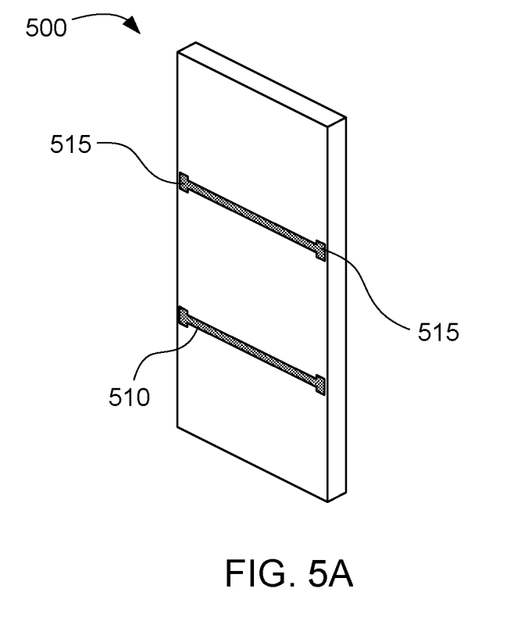
FIGS. 5A-5B are perspective views of an example three-dimensional printed article in accordance with examples of the present disclosure.
Figure 5B:
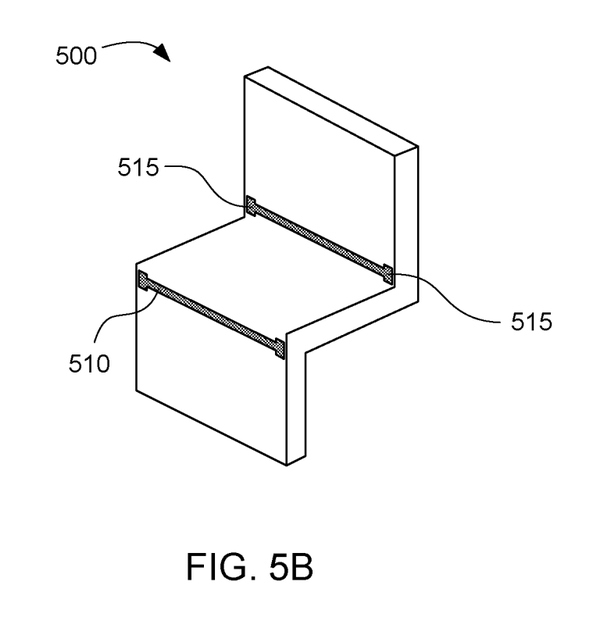

FIG. 5A shows an example 3D printed article 500 that has been made using a method as described herein, with two conductive elements 510 formed of a composite of a conductive material and polymeric build material. The conductive elements in this example include contact pads 515 to apply electric current to the conductive elements. A sufficient electric current can be passed through the conductive elements to heat the adjacent polymeric build material and soften the material until it can be bent along bend lines adjacent to the conductive elements. FIG. 5B shows the 3D printed article after being bent.

This process of changing the shape of the 3D printed article after printing can be used for any desired purpose. In some examples, the 3D printed article can be bent to fit together with another part. In a certain example, the 3D printed article may be fit together with another part and then bent to mechanically lock the 3D printed article into place. In other examples, the 3D printed article can be bent to conform to a surface of another part.

In further examples, heating the polymeric build material adjacent to the conductive element followed by cooling the polymeric build material can cause a strengthening effect. For example, the 3D printed article can be formed by fusing polymer particles. If the polymer particles are incompletely fused, then heating can cause the particles to soften or melt and fuse more completely together. Then when the 3D printed article is cooled, the strength of the polymeric build material can be increased.

Figure 6:
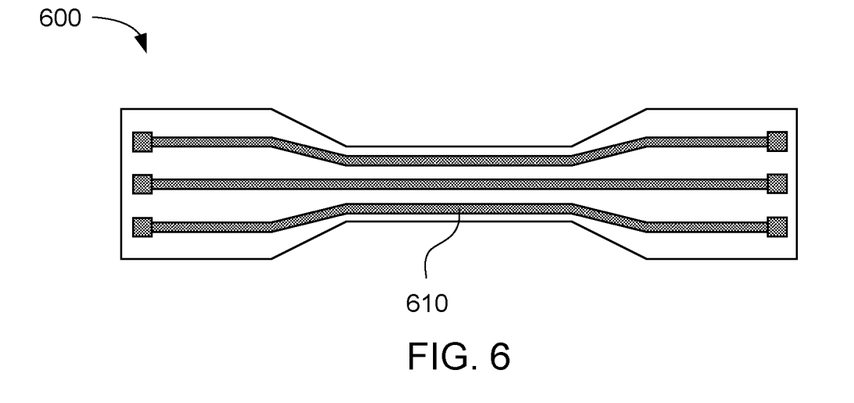
FIG. 6 is a top view of another example three-dimensional printed article in accordance with examples of the present disclosure.

FIG. 6 shows an example 3D printed article 600 having three conductive elements 610 formed therein. An electric current can be passed through the conductive elements to heat the conductive elements, which can heat and soften the polymeric build material surrounding the conductive elements. The 3D printed article can then be cooled and the polymeric build material can have a higher tensile strength compared to the original tensile strength before heating.

In various examples, the conductive elements can be located on a surface of the 3D printed article or beneath a surface of the 3D printed article. In some examples, the conductive elements can be below a surface of the 3D printed article and the conductive elements can be connected to contact pads or other electrical contacts on the surface of the 3D printed article. The electrical contacts can allow a power supply to be connected to the conductive element to pass electric current through the conductive element. In further examples, the conductive element can be beneath a surface of the 3D printed part and the electric current that is passed through the conductive element can be an induced current created by an induction power supply. Induced current can be used without any physical contact between the power supply and the conductive element. Therefore, in some examples the 3D printed part can be devoid of electrical contacts on the surface and the conductive element can be heated using induced current. In certain examples, the conductive element can include an inductively responsive material, which may be the same as the conductive material or a different material. Inductively responsive materials can include any material that can heat up in response to an inductive power source. Inductively responsive materials can include ferrous materials and alloys thereof, magnetic materials, tungsten, tin, brass, aluminum, and others.

Figure 7A:
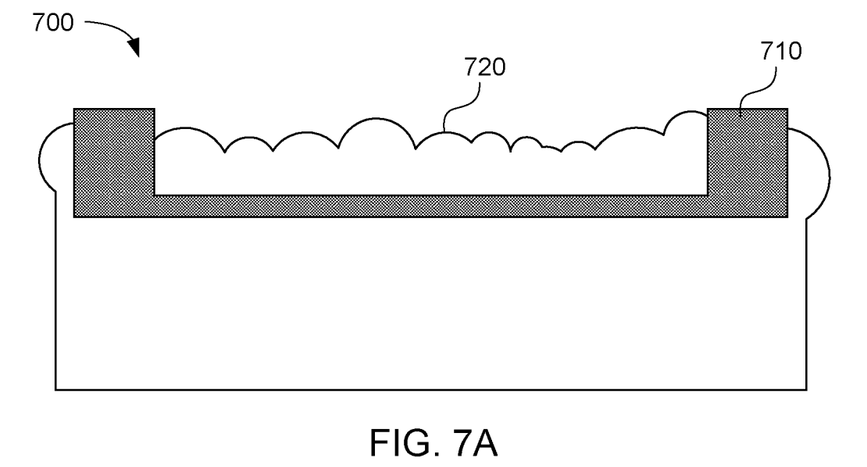
FIGS. 7A-7B are cross-sectional views of another example three-dimensional printed article in accordance with examples of the present disclosure.
Figure 7B:
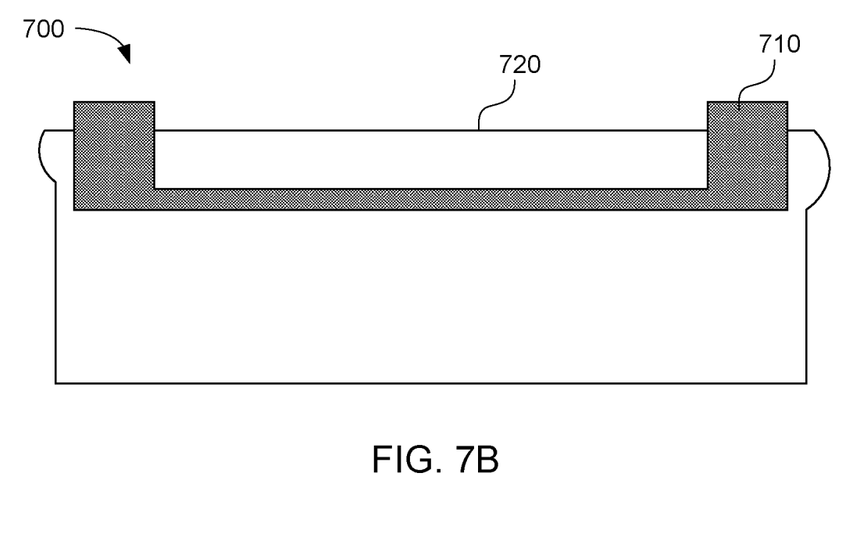

In another example, heating the conductive element can be used to modify a nearby surface of the 3D printed article. For example, a 3D printed article having a rough surface can be modified to have a smooth surface by locating a conductive element near the surface. FIG. 7A shows a cross-sectional view of an example 3D printed article 700 with a conductive element 710 that extends beneath a surface 720 of the article. In FIG. 7A, the surface is rough. In this example, the 3D printed article may be formed by partially fusing polymer powder particles. Thus, the surface can have a rough appearance due to the partially fused particles at the surface. FIG. 7B shows the 3D printed article after heating by passing current through the conductive element. The polymeric build material at the surface has melted and re-hardened to form a smooth surface. In some examples, forming a smoother surface in this way can reduce the effects of light scattering off the surface, which can give the surface a glossy appearance. Depending on the build material, in some cases this can form a semi-transparent layer at the surface. Reducing light scattering and/or forming this semi-transparent layer can create the appearance of higher color saturation of the 3D printed article. The conductive element can be located close enough to the surface that the heat from the conductive element will cause the surface to melt or soften. In certain examples, the conductive element can be formed at a distance from about 0.01 mm to about 2 mm below the surface.

Generally, the adjacent portion of the 3D printed article that is adjacent to the conductive element can include any polymeric build material that has a property changed by the heating of the conductive element. The size of the adjacent portion and the amount of polymeric build material that has a modified property can vary depending on the amount of current passed through the conductive element, the temperature of the conductive element, the heat capacity and thermal conductivity of the polymeric build material, the melting point of the polymeric build material, and so on. In certain examples, the adjacent portion can include all polymeric build material within about 0.01 mm to about 2 mm of the conductive element.

In still further examples, properties of the conductive element itself can also be changed by the heating. Because the conductive element is made up of a composite of a conductive material with a polymeric build material, the polymeric build material in the conductive element can undergo any of the property changes described above. Additionally, the conductive material can undergo property changes. In some cases, the electric resistance of the conductive element can be reduced after the heating. This may be due to the heating causing more complete fusing of conductive particles, or forming wider connections between conductive particle, In some examples, conductive element has a first resistance before the heating and a second resistance after the heating, and the first resistance is from about 10 to about 10,000 times greater than the second resistance.

Three-Dimensional Printing Systems

Figure 8:
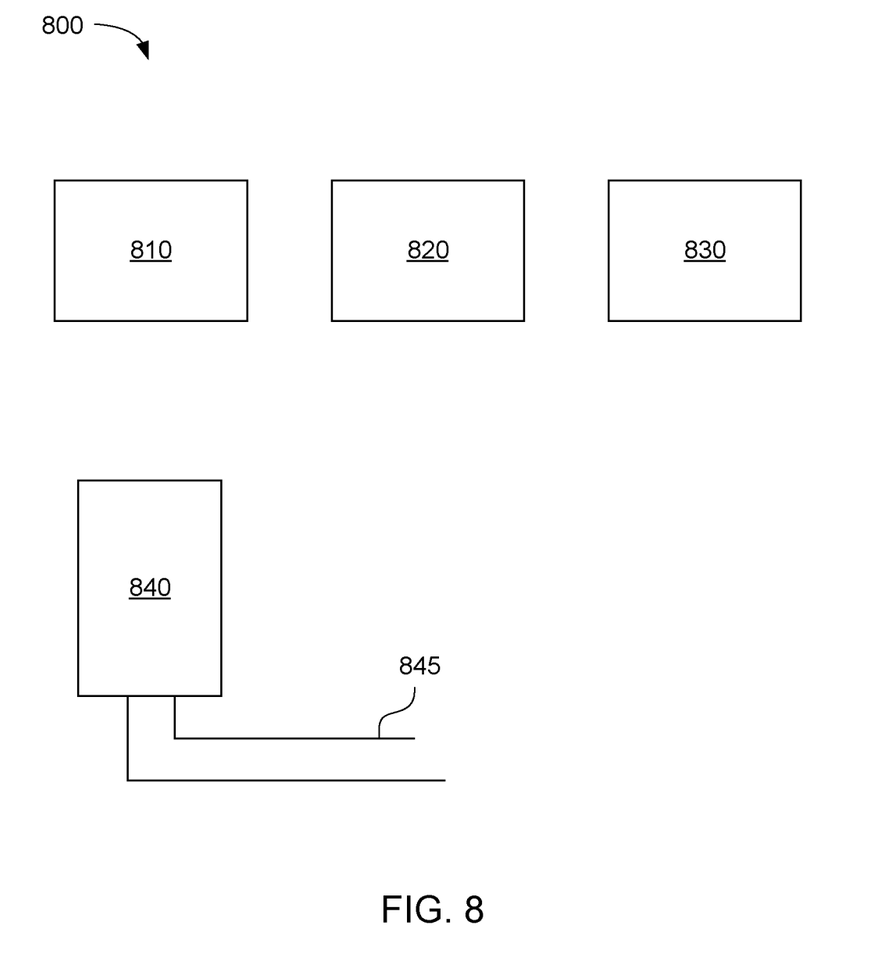
FIG. 8 is a schematic view of an example three-dimensional printing system in accordance with examples of the present disclosure.

The present disclosure also extends to three-dimensional printing systems. In some examples, a system can include the materials used for printing the 3D printed article and an electric current supply to apply an electric current across the 3D printed conductive element. FIG. 8 shows a schematic of an example three-dimensional printing system 800 in accordance with the present disclosure. The system includes: a powder build material 810 that includes polymer particles; a fusing agent 820 to apply to the powder build material; a conductive agent 830 to apply to the powder build material to form a three-dimensional printed conductive element; and an electric current supply 840 to apply an electric current across the three-dimensional printed conductive element. The electric current supply includes wires 845 to connect to electric contacts on the three-dimensional printed conductive element. As mentioned above, the fusing agent can include water and a radiation absorber, and the conductive agent can include a conductive material.

In further examples, 3D printing systems can include additional components, such as equipment for forming the 3D printed article. In certain examples, the system can include a jet fusion 3D printer with a powder bed. In this system, a bed of powder build material can be formed by introducing polymer powder from a polymer powder supply and rolling the powder in a thin layer using a roller. The fusing agent and conductive agent can be jetted onto the powder bed using fluid jet print heads. The amount of conductive agent jetted onto the powder can be calibrated based on the concentration of conductive material in the conductive agent, the desired conductivity of the resulting conductive element to be printed, among other factors. Similarly, the amount of the fusing agent used can be calibrated based the concentration of radiation absorber in the fusing agent, the level of fusing desired for the polymer particles, and other factors. In some examples, the amount of fusing agent printed can be sufficient to contact the radiation absorber with the entire layer of polymer powder. For example, if each layer of polymer powder is 100 microns thick, then the fusing agent can penetrate 100 microns into the polymer powder. Thus the fusing agent can heat the polymer powder throughout the entire layer so that the layer can coalesce and bond to the layer below. After forming a solid layer, a new layer of loose powder can be formed, either by lowering the powder bed or by raising the height of the roller and rolling a new layer of powder.

In some examples, the entire powder bed can be preheated to a temperature below the melting or softening point of the polymer powder. In one example, the preheat temperature can be from about 10° C. to about 30° C. below the melting or softening point. In another example, the preheat temperature can be within 50° C. of the melting of softening point. In a particular example, the preheat temperature can be from about 160° C. to about 170° C. and the polymer powder can be nylon 12 powder. In another example, the preheat temperature can be about 90° C. to about 100° C. and the polymer powder can be thermoplastic polyurethane. Preheating can be accomplished with a lamp or lamps, an oven, a heated support bed, or other types of heaters. In some examples, the entire powder bed can be heated to a substantially uniform temperature.

The powder bed can be irradiated with a fusing lamp. Suitable fusing lamps for use in the methods described herein can include commercially available infrared lamps and halogen lamps. The fusing lamp can be a stationary lamp or a moving lamp. For example, the lamp can be mounted on a track to move horizontally across the powder bed. Such a fusing lamp can make multiple passes over the bed depending on the amount of exposure needed to coalesce each printed layer. The fusing lamp can be configured to irradiate the entire powder bed with a substantially uniform amount of energy. This can selectively coalesce the printed portions with fusing agent leaving the unprinted portions of the polymer powder below the melting or softening point.

In one example, the fusing lamp can be matched with the radiation absorber in the fusing agent so that the fusing lamp emits wavelengths of light that match the peak absorption wavelengths of the radiation absorber. A radiation absorber with a narrow peak at a particular near-infrared wavelength can be used with a fusing lamp that emits a narrow range of wavelengths at approximately the peak wavelength of the radiation absorber. Similarly, a radiation absorber that absorbs a broad range of near-infrared wavelengths can be used with a fusing lamp that emits a broad range of wavelengths. Matching the radiation absorber and the fusing lamp in this way can increase the efficiency of coalescing the polymer particles with the fusing agent printed thereon, while the unprinted polymer particles do not absorb as much light and remain at a lower temperature.

Depending on the amount of radiation absorber present in the polymer powder, the absorbance of the radiation absorber, the preheat temperature, and the melting or softening point of the polymer, an appropriate amount of irradiation can be supplied from the fusing lamp. In some examples, the fusing lamp can irradiate each layer from about 0.5 to about 10 seconds per pass.

The electric current supply can include any device capable of passing sufficient electric current through the 3D printed conductive element to heat the conductive element. In some examples, the electric current supply can include wires or contacts for connecting physically to electric contacts on the 3D printed article. In other examples, the electric current supply can include an induction current supply capable of inducing a current in the 3D printed conductive element. The amount of current supplied can depend on the specific conductive material used in the 3D printed conductive element, the specific polymeric build material used in the 3D printed article, the cross-sectional area of the conductive element, the resistance of the conductive element, and so on.

It is noted that, as used in this specification and the appended claims, the singular forms "a," "an," and "the" include plural referents unless the context clearly dictates otherwise.

As used herein, "colorant" can include dyes and/or pigments.

As used herein, "dye" refers to compounds or molecules that absorb electromagnetic radiation or certain wavelengths thereof. Dyes can impart a visible color to an ink if the dyes absorb wavelengths in the visible spectrum.

As used herein, "pigment" generally includes pigment colorants, magnetic particles, aluminas, silicas, and/or other ceramics, organo-metallics or other opaque particles, whether or not such particulates impart color. Thus, though the present description primarily exemplifies the use of pigment colorants, the term "pigment" can be used more generally to describe not only pigment colorants, but other pigments such as organometallics, ferrites, ceramics, etc. In one specific aspect, however, the pigment is a pigment colorant.

As used herein, "ink jetting" or "jetting" refers to compositions that are ejected from jetting architecture, such as ink-jet architecture. Ink-jet architecture can include thermal or piezo architecture. Additionally, such architecture can be configured to print varying drop sizes such as less than 10 picoliters, less than 20 picoliters, less than 30 picoliters, less than 40 picoliters, less than 50 picoliters, etc.

As used herein, "average particle size" refers to a number average of the diameter of the particles for spherical particles, or a number average of the volume equivalent sphere diameter for non-spherical particles. The volume equivalent sphere diameter is the diameter of a sphere having the same volume as the particle. Average particle size can be measured using a particle analyzer such as the Mastersizer™ 3000 available from Malvern Panalytical. The particle analyzer can measure particle size using laser diffraction. A laser beam can pass through a sample of particles and the angular variation in intensity of light scattered by the particles can be measured. Larger particles scatter light at smaller angles, while small particles scatter light at larger angles. The particle analyzer can then analyze the angular scattering data to calculate the size of the particles using the Mie theory of light scattering. The particle size can be reported as a volume equivalent sphere diameter.

As used herein, the term "substantial" or "substantially" when used in reference to a quantity or amount of a material, or a specific characteristic thereof, refers to an amount that is sufficient to provide an effect that the material or characteristic was intended to provide. The exact degree of deviation allowable may in some cases depend on the specific context. When using the term "substantial" or "substantially" in the negative, e.g., substantially devoid of a material, what is meant is from none of that material is present, or at most, only trace amounts could be present at a concentration that would not impact the function or properties of the composition as a whole.

As used herein, the term "about" is used to provide flexibility to a numerical range endpoint by providing that a given value may be "a little above" or "a little below" the endpoint. The degree of flexibility of this term can be dictated by the particular variable and determined based on the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include individual numerical values or sub-ranges encompassed within that range as if each numerical value and sub-range is explicitly recited. As an illustration, a numerical range of "about 1 wt % to about 5 wt %" should be interpreted to include not only the explicitly recited values of about 1 wt % to about 5 wt %, but also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

EXAMPLES

The following illustrates examples of the present disclosure. However, it is to be understood that the following are only illustrative of the application of the principles of the present disclosure. Numerous modifications and alternative devices, methods, and systems may be devised without departing from the spirit and scope of the present disclosure. The appended claims are intended to cover such modifications and arrangements.

Example 1

A dogbone-shaped 3D printed article (hereinafter "dogbone") was created using the HP Multi Jet Fusion 3D® printing process. The dogbone had an elongated shaped with wide sections at each end and a narrow section in the middle. Three electrically conductive elements were printed in the dogbone. Each conductive element extended from the wide section at one end, through the narrow section, to the wide section at the opposite end of the dogbone. The materials used to form the dogbone were nylon 12 powder build material, a fusing agent including carbon black pigment as a radiation absorber, and a conductive agent including silver particles as the conductive material.

During the 3D printing process, individual layers of nylon 12 powder were spread on a powder bed. The conductive agent including silver particles was jetted on the areas of the bed to form the conductive elements. Two passes of a fluid jet printhead were used to apply the conductive agent. Two additional passes of fluid jet printheads were used to apply fusing agent and detailing agent. The powder bed was irradiated with a heating lamp to reach a temperature of 174-177° C. during application of the conductive agent and 187-192° C. during application of the fusing agent. Several dogbones were printed.

The contacts at the ends of the conductive elements were connected to a multimeter to measure baseline resistance of the conductive elements. A current-controlled power supply was then attached. Current was applied to the conductive elements, and a reduction in the resistance of the conductive elements was observed. A first group of dogbones were treated with current for a shorter time, and a second group of dogbones were treated with current for a longer time. A third group of dogbones was not treated with current.

The three groups of dogbones were then tested for elongation and ultimate tensile strength. The results are shown in Table 1:

TABLE 1

|  | Ultimate Tensile Strength | Elongation |
|---|---|---|
| No Treatment | 31 MPa | 2.4 mm |
| Light Treatment | 37 MPa | 2.8 mm |
| Heavy Treatment | 35 MPa | 3.3 mm |

These results show that light treatment and heavy treatment with electric current can result in varying degrees of change for elongation and ultimate tensile strength. It was also observed that the surface of the dogbones treated with electric current became smoother and glossier near the conductive elements. The resistance of the conductive elements themselves also was reduced by the heating, so that more electric current could be run through the conductive elements after the treatment. This is likely due to annealing of the silver particles caused by the heating.

What is claimed is:

1. A method of making a three-dimensional printed article, the method comprising:
    printing a conductive element comprising a composite of a conductive material and a polymeric build material;
    printing an adjacent portion in contact with the conductive element, wherein the adjacent portion comprises the polymeric build material;
    based on a three-dimensional object model, selectively jetting a fusing agent onto the composite and onto the adjacent portion, wherein the fusing agent comprises water and a radiation absorber;
    exposing the composite and the adjacent portion to energy to selectively fuse the polymeric build material in contact with the radiation absorber to form the three-dimensional printed article;
    cooling the three-dimensional printed article; and
    then heating the conductive element in the three-dimensional printed article by running an electric current through the conductive element, wherein the heating of the conductive element also heats the adjacent portion to a temperature sufficient to change a physical property of the fused polymeric build material of the adjacent portion.

2. The method of claim 1, wherein the physical property is selected from the group consisting of tensile strength, elasticity, density, surface roughness, abrasion resistance, rebound, compression, porosity, elongation, hardness, and a combination thereof.

3. A method of making a three-dimensional printed article, the method comprising:
   printing a conductive element comprising a composite of a conductive material and a polymeric build material;
   printing an adjacent portion in contact with the conductive element, wherein the adjacent portion comprises the polymeric build material; and
   heating the conductive element by running an electric current through the conductive element, wherein the heating of the conductive element also heats the adjacent portion to a temperature sufficient to change a physical property of the polymeric build material of the adjacent portion;
   wherein the heating softens the adjacent portion of the three-dimensional printed article and the method further includes bending the three-dimensional printed article at the adjacent portion.

4. The method of claim 3, wherein the bending of the three-dimensional printed article comprises fitting the three-dimensional printed article to a second article, and the method further comprises cooling the bent three-dimensional printed article so that the three-dimensional printed article maintains the bent configuration.

5. The method of claim 1, wherein the conductive element is formed at a distance from about 0.01 mm to about 2 mm below a surface of the three-dimensional printed article, wherein the adjacent portion of the three-dimensional printed article is at the surface, and wherein the heating of the conductive element in the three-dimensional printed article softens the adjacent portion and causes the surface of the three-dimensional printed article to become smoother at the adjacent portion.

6. The method of claim 1, wherein the conductive element has a first resistance before the heating and a second resistance after the heating, and wherein the first resistance is from about 10 to about 10,000 times greater than the second resistance.

7. The method of claim 1, wherein the conductive material is selected from the group consisting of silver particles, copper particles, gold particles, nickel particles, carbon particles, and a combination thereof.

8. The method of claim 1, wherein the conductive element further comprises an inductively responsive material.

9. The method of claim 1, wherein the polymeric build material is selected from the group consisting of nylon 6, nylon 9, nylon 11, nylon 12, nylon 66, nylon 612, polyethylene, thermoplastic polyurethane, polypropylene, polyester, polycarbonate, polyether ketone, polyacrylate, polystyrene, polylactic acid, acrylonitrile butadiene styrene, and a mixture or copolymer thereof.

10. A method of making a three-dimensional printed article, the method comprising:
    iteratively applying individual build material layers of polymer particles of a polymeric build material to a powder bed;
    based on a three-dimensional object model, selectively jetting a fusing agent onto the individual build material layers, wherein the fusing agent comprises water and a radiation absorber;
    based on the three-dimensional object model, selectively jetting a conductive agent onto portions of the individual build material layers to form a conductive element comprising a composite of a conductive material and the polymeric build material;
    exposing the powder bed to energy to selectively fuse the polymer particles in contact with the radiation absorber at individual build material layers to form the three-dimensional printed article;
    cooling the three-dimensional printed article; and
    then heating the conductive element in the three-dimensional printed article by running an electric current through the conductive element, wherein the heating of the conductive element also heats an adjacent portion of the three-dimensional printed article to a temperature sufficient to change a physical property of the fused polymeric build material of the adjacent portion.

11. The method of claim 10, wherein the physical property is selected from the group consisting of tensile strength, elasticity, density, surface roughness, abrasion resistance, rebound, compression, porosity, elongation, hardness, and a combination thereof.

12. The method of claim 10, wherein the radiation absorber is selected from the group consisting of carbon black, a near-infrared absorbing dye, a near-infrared absorbing pigment, a tungsten bronze, a molybdenum bronze, metal nanoparticles, a conjugated polymer, and a combination thereof.

13. The method of claim 10, wherein the heating softens the adjacent portion of the three-dimensional printed article and the method further includes bending the three-dimensional printed article at the adjacent portion.

14. The method of claim 13, wherein the bending of the three-dimensional printed article comprises fitting the three-dimensional printed article to a second article, and the method further comprises cooling the bent three-dimensional printed article so that the three-dimensional printed article maintains the bent configuration.

15. The method of claim 10, wherein the conductive element further comprises an inductively responsive material.

* * * * *